MATRIX SELECTION CIRCUIT WITH AUTOMATIC DISCHARGE CIRCUIT

Filed Aug. 16, 1963 2 Sheets-Sheet 1

INVENTOR
CARL HEINZ MEYER
BY Rene A. Kuypers
ATTORNEY

Nov. 21, 1967 C. H. MEYER 3,354,321

MATRIX SELECTION CIRCUIT WITH AUTOMATIC DISCHARGE CIRCUIT

Filed Aug. 16, 1963 2 Sheets-Sheet 2

3,354,321
MATRIX SELECTION CIRCUIT WITH AUTOMATIC DISCHARGE CIRCUIT

Carl Heinz Meyer, Philadelphia, Pa., assignor to Sperry Rand Corporation, New York, N.Y., a corporation of Delaware Filed Aug. 16, 1963, Ser. No. 302,561
7 Claims. (Cl. 307—88.5)

ABSTRACT OF THE DISCLOSURE

This invention relates to a matrix selection circuit having an automatic discharge of the distributed capacitance associated with the energizing of a selected load. A matrix selection circuit may be used, for example, in a computer where it is required to select certain memory cells of a memory bank. A load is selected by energizing a first selection circuit in conjunction with the energizing of any one of a plurality of second selection circuits. The distributed capacitance associated with the connecting lines to the load thereby become charged. This distributed capacitance is automatically discharged after the load is energized by a third circuit associated with the first and with each one of the plurality of second circuits. This circuit arrangement allows high speed selection to be realized.

This invention relates to a circuit which discharges the distributed or stray capacitance present across an electrical load. This invention relates in particular to a pulse forming circuit which includes a circuit which automatically discharges the distributed capacitance which is associated with an energized electrical load.

A known prior art circuit designed to discharge distributed capacitance (i.e., the capacitance normally associated with connecting wires but in this case it will denote not only this capacitance, but in addition will refer to the capacitance due to the nature of the load, e.g., the word line in a thin film memory) requires proper timing for its operation, which is supplied by a clock pulse generator. The clock pulses are applied to the grid of a vacuum tube so that the positive portion of the signal causes the tube to conduct, thereby providing a discharge path for the distributed capacitance through the tube. This type of discharge circuitry is therefore limited because of its dependence upon timing and because of the requirement for additional circuitry.

It is, therefore, an object of this invention to provide a new and improved distributed capacitance discharge circuit.

A further object of this invention is to provide a new and improved distributed capacitance discharge circuit which is characterized by a simple mode of operation.

It is another object of this invention to provide a new and improved distributed capacitance discharge circuit which is characterized by an automatic mode of operation.

In accordance with a feature of this invention there is provided a high speed pulse forming circuit which incorporates a discharge circuit to discharge the stray capacitance developed whenever a current load is energized. The pulse circuit is connected in the form of a matrix selection network so that any one of a plurality of loads can be selectively energized. The discharge circuit is so connected in the matrix selecting network that whenever any one of several current loads is energized, the stray capacitance associated therewith is automatically discharged.

In accordance with another feature of this invention, a stray capacitance discharge circuit is provided for each of a plurality of current loads. Thus, whenever any load is energized by the matrix selection circuit, the stray capacitance associated with the load is automatically discharged through its own discharge circuit, by a self-selection operation. The self-selecting feature of this invention refers to the fact that the distributed capacitance across any energized load selects its own discharge circuit without the need of any external timing circuitry or steering circuitry.

The novel features which are considered characteristic of this invention are set forth with particularity in the appended claims. The invention itself, however, both as to its organization and method of operation, as well as additional objects and advantages thereof will best be understood from the following description when considered in connection with the accompanying drawings, in which:

Figures 1, 2:
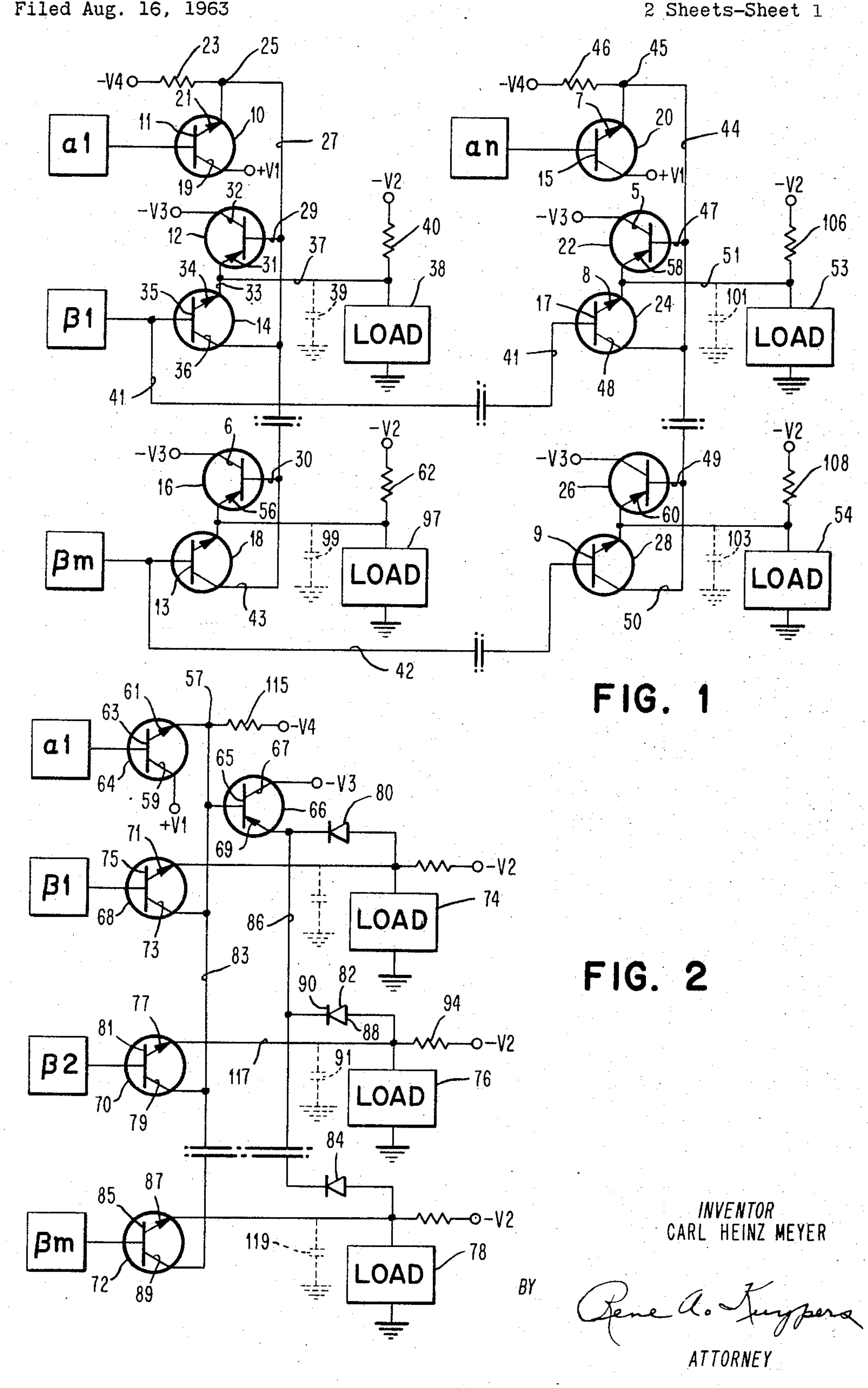
FIGURE 1 depicts a schematic of a matrix selection circuit having two columns and two rows and which incorporates the distributed capacitance discharge circuit provided by the instant invention.
FIGURE 2 depicts another embodiment of a matrix selection circuit having one column and three rows and which provides a distributed capacitance discharge circuit incorporating unilateral current conducting devices.

In carrying out the instant invention there is provided an $n$ (i.e., the total number of columns) by $m$ (i.e., the total number of rows) matrix selection circuit incorporating several switching transistors. For the sake of convenience, each transistor that supplies input current to an associated column of transistors is designated as a $\alpha$ transistor; similarly, the transistor corresponding to the respective transistor that supplies input current to a load is designated a $\beta$ transistor. The transistors of the matrix are arranged so that a single $\alpha$ transistor is interconnected to a plurality of $\beta$ transistors. Each transistor of the matrix may be forward biased by an appropriate energizing source. Also connected to each different one of the plurality of $\beta$ transistor switches is another transistor, which comprises the discharge circuit of the instant invention. Electrical loads are provided, each different one being connected to an associated interconnection between one of the plurality of $\beta$ transistors and its respective discharge transistor.

When a $\alpha$ transistor and any one of the plurality of $\beta$ transistors associated therewith comprising the $n$ by $m$ matrix selection circuit are forward biased by their respective energizing sources, a current flow is established through the selected $\alpha$ and $\beta$ transistors to the respective load associated with the $\beta$ transistor. Prior to and during the energizing of a particular load, the discharge transistor remains back biased.

In view of the nature of the load, for example, a word line driver in a thin film memory wherein the bit and sense line overlays are placed in juxtaposition and orthogonal to the word driver there may be as much as several thousand picofarads of distributed capacitance present. In addition, there is present stray capacitance due to the length of connecting wire to the load. This total distributed capacitance (stray capacitance on wire and load) which appears across the energized load must be discharged in a short period of time in order to enhance high speed circuit operation. The discharging of the total distributed capacitance improves circuit operation since the RC time constant of the circuit is substantially reduced.

Therefore, as soon as a selected load has been energized by forward biasing an appropriate α transistor and any one of the associated plurality of β transistors of the matrix selection circuit, the distributed capacitance simultaneously begins charging up to the voltage level across the load. As soon as the α and β transistor switches are turned off thereby becoming back biased, the transistor discharge circuit, which has heretofore been back biased, now becomes forward biased due to the voltage across the distributed capacitance and therefore the latter immediately discharges through the transistor. In the event that another load would have been energized by selecting different α and β transistor switches of the matrix selection circuit, the distributed capacitance present across the energized load would have been discharged in a similar manner through its own discharge transistor circuit. In this manner, it becomes evident that each energized load of a matrix selection ciruit has its own distributed capacitance discharge circuit and the discharge of the distributed capacitance associated with any load takes place automatically and on a self-selecting basis (i.e., the distributed capacitance present across any energized load selects and is automatically discharged through its own discharge circuitry as soon as the voltage across the distributed capacitance is of sufficient magnitude to forward bias a discharge transistor associated with the energized load).

By adapting the above described circuit through the use of diodes, the number of discharge circuits can be reduced so that instead of one discharge circuit per load only one discharge circuit per matrix column need be employed. In this embodiment, each individual load of a matrix selection is connected through a respective diode which terminates in a single transistor discharge circuit. During the quiescent state and when a load is being energized, the respective diode connected thereto as well as the single discharge transistor remains back biased. However, if a particular load of a matrix selection circuit is energized thereby charging-up the distributed capacitance across the load, the diode connected to the particular load in question and the discharge transistor will become forward biased as soon as the matrix selection circuit (i.e., the row and column transistor switch) returns to the quiescent state. The distributed capacitance is then discharged through the diode and through the common transistor discharge circuit. The above discussed embodiments of the instant invention will become clearer when considered in more detail.

Referring now to the drawings and in particular to FIGURE 1, an *n* by *m* transistor matrix selection circuit is depicted having two columns and two rows in which any one of a plurality of loads, such as 38, 53, 54 or 97 may be selectively energized. The α transistors are 10 and 20 while the β transistors are 14, 18, 24 and 28. It is understood that the number of rows and columns described with respect to FIGURE 1 as well as the remaining figures may be modified without departing from the spirit of this invention. In order to select any one of the loads, it is necessary that the β transistor associated with the load and the α transistor associated with the last mentioned β transistor be simultaneously energized. Thus, for example, to matrix-select and energize load 38, the NPN transistors 10 and 14 must simultaneously be energized by their respective sources, α1 and β1. In like manner, in order to energize the load 54, it is necessary to simultaneously energize the transistor switches 20 and 28 through their respective energizing sources α*n* and β*m*.

For each of the loads 38, 53, 54 and 97, there is a different operatively associated distributed capacitance discharge circuit comprising transistors 12, 22, 26 and 16, respectively. In the drawings, for purposes of understanding, distributed or stray capacitances 39, 99, 101 and 103 are shown as lumped capacitances and in dotted lines and are connected in parallel across each current load 38, 97, 53 and 54, respectively. The distributed capacitances are shown as lumped capacitances and in dotted form although they are not actually individual circuit components, but nevertheless each is charged up whenever its associated one of the loads 38, 53, 54, or 97 is selectively energized by the matrix selection circuit.

Before the transistors 10 and 14 are forward biased, they are kept back biased during the quiescent state by negative potentials from sources α1 and β1, which are applied to the base electrodes 11 and 35, respectively. Thus, the NPN transistor 10 is back biased by a negative potential applied by α1 to the base 11. This potential is more negative than the —V4 applied to the emitter 21; (i.e., the absolute value of —V4 is greater than the absolute value of the negative potential applied by α1); similarly, the negative voltage applied by β1 to the base 35 of NPN transistor 14 is more negative than —V2 applied to the emitter electrode 34 via resistor 40 and connectors 37 and 33 (i.e., the absolute value of —V2 is greater than the absolute value of the negative potential applied by β1). The switching transistors 18, 20, 24 and 28 are also kept back biased by applying a negative potential to the respective base electrodes 13, 15, 17 and 19. The voltage, —V2, is more negative than —V4 (i.e. the absolute value of —V4 is greater than the absolute value of —V2), and therefore the PNP discharge transistors 12, 16, 22 and 26 are also back-biased since their respective bases 29, 30, 47 and 49 are made more positive by —V4 applied via the resistors 23 and 46 than are emitters 31, 56, 58 and 60, which have —V2 applied thereto via the respective resistors 40, 62, 106 and 108. When the above-mentioned circuit conditions exist, no current flows into the loads 38, 53, 54 and 97.

To matrix-select the load 38, positive potential pulses are applied by α1 and β1 to the base electrodes 11 and 35, respectively. The positive pulses applied by α1 and β1 cause the transistors 10 and 14 to become forward biased since the emitter electrodes 21 and 34 thereof are made negative with respect to their respective base electrodes 11 and 35. As soon as transistors 10 and 14 are forward biased, current is conducted from +V1 through the collector electrode 19 and out of the emitter electrode 21 through the resistor 23 to —V4. A current conduction path is also established from the lower terminal 25 of resistor 23, through the connector 27, into the collector 36 and out of the emitter 34 of transistor 14, along the second connector 33 and the third connector 37 to the load 38 to ground. A small portion of current flows along connector 37 to —V2, via resistor 40. This current is of relatively small magnitude since the resistor 40 is a much higher resistance than is the impedance of load 38.

At the terminal 25 of resistor 23, the potential is slightly less positive than that of +V1 because of the small voltage drop through the transistor 10. The positive potential at the terminal 25 of resistor 23 is transmitted by the connecting means 27 to the collector 36 of transistor 14 and to the base 29 of the discharge transistor 12. The positive potential transmitted by line 27 (i.e., +V1 less the voltage drop through transistor 10) is further reduced in magnitude at the second connector 33 after current is conducted through transistor 14 (i.e., the positive voltage at emitter 34 or connector 33 equals +V1 less the voltage drop through transistors 10 and 14). The voltage drop across transistor 14 also assures that the discharge transistor 12 is back biased at this time. As a consequence of the above-mentioned voltage drops through transistors 10 and 14, and the forward biasing of transistors 10 and 14, the distributed capacitance 39 is charged up to the voltage present at the emitter 34.

The portion of the matrix-selection circuit comprising the transistors 10 and 14 is only momentarily energized (for the period of the pulse time) by their respective energizing means $\alpha 1$ and $\beta 1$. Such a mode of operation is required, for example, in a digital computer memory where it is necessary to read out a certain memory word address with a pulse technique. Therefore, as soon as $\alpha 1$ and $\beta 1$ reverts to its quiescent state thereby back biasing transistors 10 and 14 (i.e., the base electrodes 11 and 35 are made more negative than the respective emitters 21 and 34), the voltage on the connecting line 27 as well as the base 29 of transistor 12 returns to −V4. The charging up of the distributed capacitance 39 to approximately +V1 causes transistor 12 to immediately become forward biased since the emitter 31, which is at this potential, is now more positive than the base 29. As soon as transistor 12 becomes forward biased, the distributed capacitance 39 is immediately discharged through a low impedance path consisting of the connecting lines 37 and 33, the emitter 31 and the collector 32 to −V3.

It is thus seen that the distributed capacitance 39 associated with the energized load 38 is automatically discharged through its own discharge circuit comprising transistor 12. The automatic discharging occurs as soon as the distributed capacitance is charged up to the voltage across the load and is of sufficient magnitude to forward bias a discharge transistor. This type of circuit operation is considered to be self-selecting insofar as the distributed capacitance across any energized load selects its own discharge circuit without the need of any external timing or steering circuits. Thus, had the load 54 been selectively energized by forward biasing the transistor 20 and 28 by means of the $\alpha n$ and $\beta m$, the distributed capacitance 103 would automatically be discharged through the circuit provided by transistor 26. The distributed capacitance associated with each energized load discharges mainly through the low impedance discharge paths associated with each load, consisting respectively of the transistors 12, 16, 22 and 26.

In view of the rapid discharge of the distributed capacitance 39 by the self-selecting system of the instant invention, the RC constant of the load 38 is substantially reduced. Consequently, the matrix-selection circuit can be operated at a high repetition rate because the output pulses generated across the respective loads are generated with a steep lagging edge.

FIGURE 2 shows another embodiment of the instant invention wherein the stray or distributed capacitance discharge circuit of each of the current loads 74, 76 and 78 comprises respective diodes 80, 82 and 84, each of which is terminated in a single discharge transistor 66. The one by three (i.e., one column by three row) transistor matrix selection circuit of FIGURE 2 operates in a similar manner to that described in FIGURE 1. Before selecting a particular load which is to be energized, the NPN transistors comprising the selection circuit, namely, 64 68, 70 and 72 are back biased in the quiescent state by a negative potential applied to their respective base electrodes 63, 75, 81 and 85 by the respective energizing means $\alpha 1$ and $\beta 1$ through $\beta m$. Thus, the potential applied by $\alpha 1$ to the base 63 of transistor 64 is more negative than −V4 applied to the emitter 61. Also, the potential applied in the quiescent state by $\beta 1$ through $\beta m$ to the base elements 75, 81 and 85, respectively, is more negative than −V2 applied to each emitter, namely 71, 77 and 87. Furthermore, the absolute value of −V4 is greater than the absolute value of −V2. Therefore, the discharge transistor 66 is also back biased in the quiescent state since −V4 applied through resistor 115 to the base 65 is more positive than −V2 at the emitter 69. The diodes 80, 82 and 84 are also back biased since −V2 applied at the anode electrodes, as for example anode 88 of diode 82, is more negative than the potential applied to the cathodes such as cathode 90, which is at a potential between −V4 and −V2.

Whenever it is desired to selectively energize a particular load, the correct $\alpha$ and $\beta$ devices are simultaneously energized. Thus, by forward biasing the transistors 64 and 70 by applying positive potentials to the respective base electrodes 63 and 81 by means of $\alpha 1$ and $\beta 2$ (i.e., the emitters 61 and 77 which are at a potential −V4 and −V2, respectively, are less positive than the pulses applied by $\alpha 1$ and $\beta 2$ to the base electrodes 63 and 81, respectively), the load 76 is energized. It should be noted that the other side of the load 76 is at ground potential. By forward biasing the transistors 64 and 70, current flow is established from +V1 at transistor 64 through the collector 59 and the emitter 61, through the resistor 115 to −V4. Current also flows from the lower terminal 57 of resistor 115, through the connecting line 83, the collector 79 and the emitter 77 of transistor 70, the second connecting line 117 and the load 76 to ground. Current also flows to −V2 via the resistor 94. Resistors 94 and 115 are relatively high values so that little current flows therethrough.

As current flows into the load 76, charging current also flows into the distributed capacitor 91 so that it is charged up to the voltage present at the emitter 77 of transistor 70. As mentioned above, the voltage at the emitter electrode 77 is substantially equal to +V1 at the collector 59 of transistor 64, less the voltage drops through the transistors 64 and the transistor 70 due to the current conduction therethrough. During the energizing of the load 76, the PNP discharge transistor 66 remains back biased since the potential at the base 65 thereof (i.e., +V1 less the voltage drop through transmitter 64) is more positve than the positive potential at the emitter 69 (i.e., +V1 less the voltage drops through transistors 64 and 70).

As soon as the positive voltage that is applied to the base electrodes 63 and 81 by $\alpha 1$ and $\beta 2$, is returned to a quiescent negative potential thereby again back biasing transistors 64 and 70, the discharge transistor 66 immediately becomes forward biased. Transistor 66 becomes forward biased since the voltage at the lower terminal 57 of resistor 115 returns to −V4 and this voltage is transmitted by connector 83 to the base 65 of transistor 66. The potential at the anode 88 of diode 82 which is at approximately +V1 is higher than the cathode 90 and hence, transistor 66 is turned on thereby allowing current to flow from the anode 88 to the cathode 90 of diode 82, through the connector 86, the emitter 69 and the collector 67 to −V3. Therefore, as soon as diode 82 and discharge transistor 66 become forward biased, the distributed capacitance 91 immediately discharges through the low impedance path provided by diode 82, the emitter 69 and the collector 67 of transistor 66 to −V3. The stray capacitance 91 discharges only partly through resistor 94 to −V2 since this circuit provides a higher resistance path than does the above-mentioned low impedance path.

Thus it is apparent that the discharge capacitance 91 is automatically discharged in accordance with a self-selecting circuit consisting of diode 88 associated with the energized load 76, and a common discharge transistor comprising transistor 66. In a similar manner, the distributed capacitance of any of the other loads can be automatically discharged on a self-selecting basis by means of the diode connected to the particular energized load and the common transistor 66. By way of example, by energizing the switching transistor 64 and 72 by means of $\alpha 1$ and $\beta m$, respectively, the distributed capacitance 119, associated with the load 78 would automatically be discharged by self-selection through the diode 84 and the transistor 66 after transistors 64 and 72 are returned to the qiescent state.

Figure 3:
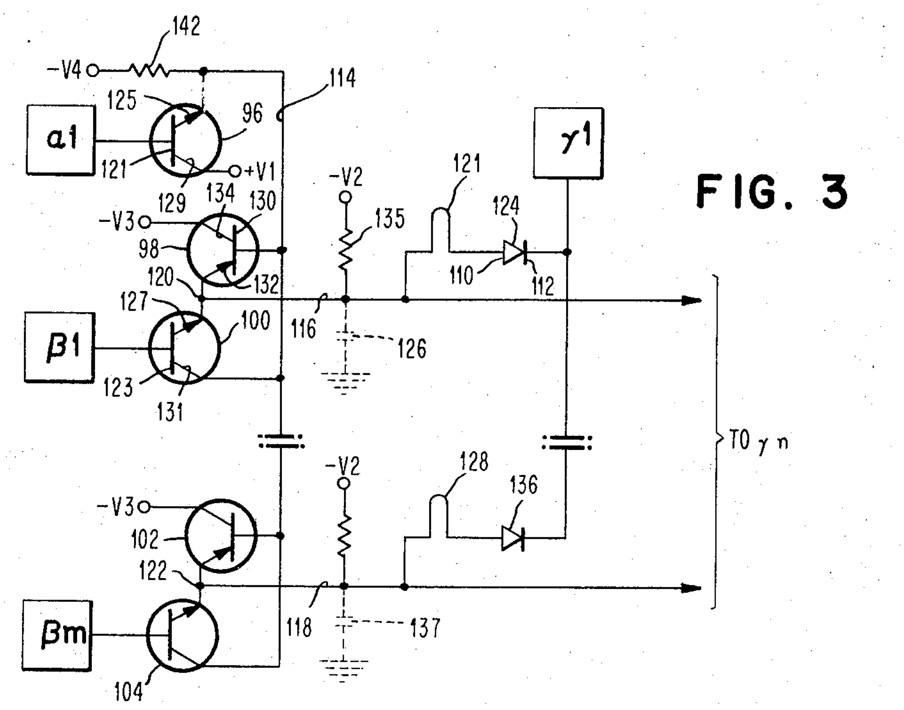
FIGURE 3 depicts a further embodiment wherein a matrix is provided having one column and two rows and which incorporates the capacitance discharge current of the instant invention.

FIGURE 3 shows another embodiment of the instant invention which is similar in operation to FIGURE 1, but the circuit further depicts a word line for use in a thin film memory. In this particular embodiment, the pulse sources α1, γ1, and either β1 or β*m* must simultaneously be energized in order to matrix-select either the load 120 or 128. Current loading means 120 and 128 consist, by way of example, of a word line or word driver strap which is used to read out a particular word address of a thin film digital computer memory. A word strap is used to rotate the magnetic vectors of several thin film spots which are located beneath the word strap from the "easy" toward the "hard" axes of magnetization. As is well known, the read out of a particular word address of a computer memory is operated upon by the arithmetic circuits of the computer.

If it is desired, for example, to read out a memory address associated with the word strap 120, it is necessary to energize simultaneously α1, β1, and γ1, in order to forward bias transistors 96 and 100 as well as diode 124. Before the NPN transistors 96 and 100 are forward biased by α1 and β1, respectively, (i.e., transistors 96 and 100 are in the quiescent state) they are kept back biased by negative potentials applied to their respective base electrodes 121 and 123; in like manner, diode 124 is kept back biased by a positive potential applied by γ1 to the cathode 112 which the anode 110 therefore is held negative by —V2. As is understood, the potentials applied to the base electrodes 121 and 123 are made more negative than —V4 or —V2, which are applied to the emitter electrodes 125 and 127 respectively, via the resistors 142 and 135. The PNP discharge transistor 98 is also back biased in the quiescent state since the absolute value of —V4 applied to the base 130 via resistor 142 is greater than the absolute value of —V2 applied via resistor 135.

As soon as positive pulses are applied to the bases 121 and 123 by α1 and β2, respectively, and a negative potential is applied by γ1 to the cathode 112 of diode 124, transistors 96 and 100 as well as diode 124 become forward biased. Current thereby flows from +V1 through the collector 129 of transistor 96 through the emitter 125 and the resistor 142 to —V4. Current also flows through the connecting means 114, through the collector 131 and the emitter 127 of transistor 100, the second and third connecting means 120 and 116, respectively, the word driver 121 to γ1 via the diode 124. A small amount of current also flows through the resistor 135 to —V2. The PNP transistor 98 remains back biased when transistors 96 and 100 are being forward biased since the positive potential at the base 130 is slightly more positive than the positive potential at the emitter 132. As similarly discussed with regard to FIGURES 1 and 2, the positive potential at the base 130 has a magnitude of +V1 less the voltage drop through the transistor 96, whereas the positive potential at the emitter electrode 132 is equal to the +V1 less the voltage drop not only through the transistor 96 but also through the transistor 100. When the current word line 121 is energized, there is a simultaneous charging up of the distributed capacitance 126 associated therewith. The distributed capacitance 126 is charged up to the voltage that appears at the terminal 120. Since the distributed capacitance 126 charges up approximately to +V1, and since by back biasing the transistors 96 and 100, the diode 124 (i.e., after α1, β1 and γ1 return to the quiescent state) the base electrode 130 of transistor 98 has —V4 applied thereto via resistor 142 and connector 114, the transistor 98 immediately becomes forward biased. Therefore, the distributed capacitance 126 immediately discharges through the low impedance path provided by connectors 116 and 120, the emitter-collector electrodes 132 and 134, respectively, to —V3. A small portion of the discharge current also flows through the high resistance path provided by resistor 135 and —V2.

It is therefore apparent that by the particular circuit arrangement provided, the distributed capacitance associated with a selected load of a matrix selection circuit may be automatically discharged through its own discharge circuit. Thus, it should be apparent that the distributed capacitance 137 associated with the energizing of the word strap 128 may be automatically discharged through its own transistor discharge circuit 102 in the event that transistors 96, 104 and the diode 136 are simultaneously forward biased and then returned to their quiescent state through the operation of α1, βm, and γ1.

Figure 4:
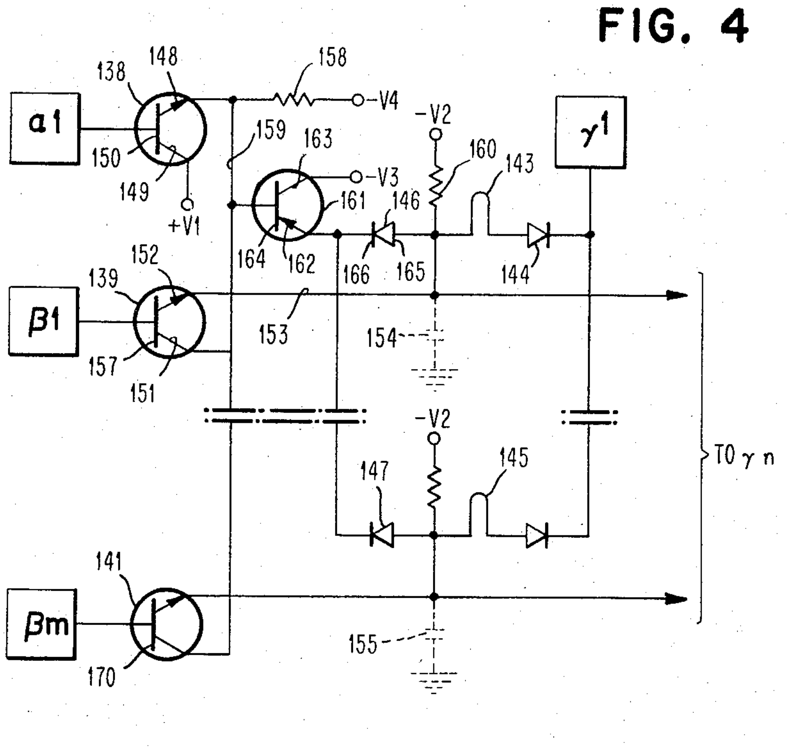
FIGURE 4 shows still another embodiment wherein a matrix selection circuit is provided having one column and two rows which incorporates the capacitance discharge circuit of the instant invention including unilateral current conducting devices.

FIGURE 4 is another embodiment of a matrix selection circuit which is similar in operation to FIGURE 3 except that the number of discharge circuits is reduced by employing several diodes. In order to energize word line 143, for example, there must be the simultaneous forward biasing of the transistors 138 and 139 and at the same time there must be a forward biasing of diode 144.

Before any of the NPN transistors 138, 139 and the diode 144 are forward biased (i.e., when they are in the quiescent state), they are kept back biased by the negative potential supplied to the respective base electrodes 150 and 157 by α1 and β1. The negative potential supplied by α1 is more negative than the —V4 applied to the emitter 148 via the resistor 158; similarly, the negative potential applied by the β1 to the base 157 of transistor 139 is more negative than —V2 applied to the emitter electrode 152 via the resistor 160. The PNP discharge transistor 161 also remains back biased during the quiescent state of transistors 138 and 139 since the absolute value of —V4 is greater than the absolute value of —V2 and therefore, the base 164 is more positive than the emitter 162, which is at some potential between —V2 and —V4.

By simultaneously forward biasing transistors 138 and 139 by means of α1 and β1, respectively, and by forward biasing diode 144 by applying a negative pulse by means of γ1, the transistors 138 and 139 conduct current to the load 143. The transistor 161 remains back biased, however, since the drop across the transistor 139 (i.e., the collector 151 to the emitter 152) appears across the emitter 162, base 164 junction as well as across the cathode 166, anode 165 of transistor 161 and diode 146, respectively. Thus, current is conducted from +V1, through the collector and emitter 149 and 148, respectively, of transistor 138, the resistor 158 to —V4. Current is also conducted from the emitter 148, the conductor 159, the collector and emitter electrodes 151 and 152, of transistor 139, the connector 153 to γ1 via the word line 143 and the diode 144. Current is also conducted from the emitter 152 of transistor 139 through the connector 153 to —V2 via the limiting resistor 160. However, since the resistor 160 is a relatively high resistance with respect to the impedance of load 143, very little current flows through the path.

The diode 146 is back biased during the quiescent period of transistors 138 and 139 since the anode 165 is maintained more negative by —V2 than is the cathode 166, which is at a potential between —V2 and —V4 and hence is more positive. As soon as the α1, β1, and γ1 are returned to their quiescent states, the base electrode 164 of discharge transistor 161 has —V4 applied to it via the resistor 158 and connecting line 159. Due to the potential to which the distributed capacitance 154 was charged (i.e., approximately V1) current will flow from the capacitor 154, through the anode 165 and the cathode 166 of diode 146, the emitter 162 and collector 163 to —V3, thereby forward biasing discharge transistor 161. Hence, a low impedance discharge path is provided for the distributed capacitance 154 through the diode 146, the emitter 162 and the collector 163 of transistor 161 and —V3. This discharge circuit is self-selecting since as soon as the distributed capacitance 154 is charged up, and α1, β1, and γ1 return to their quiescent state, it automatically forward biases the diode 146 thereby causing the discharge transistor 162 to become forward biased. In like manner, the distributed capacitance 155 may be automatically discharged on a self-selecting basis provided the load 145 were energized by the simultaneous energizing of α1, β*m* and $\gamma 1$. The distributed capacitance 155 discharges by self-selecting the current conduction path provided by the diode 147 and the discharge transistor 161.

In summary, an automatic, self-selecting distributed capacitance discharge circuit has been provided wherein the distributed capacitance associated with the energizing of a particular load in a transistor matrix selection circuit discharges through its own current conducting path. The discharge circuit operates automatically since no external pulse generating means is required to discharge the capacitance, but rather, the discharging scheme operates as soon as the distributed capacitance is charged up to a certain value and the input pulses are terminated. The automatic and self-selecting feature of the present invention provides a matrix selection circuit which operates at a high repetition rate since the RC time constant associated with the de-energizing of a particular load is kept at a minimum.

The embodiments of the invention in which an exclusive property or privilege is claimed are defined as follows:

1. An electrical signal switching circuit comprising, at least a first signal switching device having input means and output means, said input means adapted to be connected to an energizing source, first connecting means, at least second and third switching devices, each having input means and output means, said input means of said second and third signal switching devices adapted to be respectively connected to a different associated energizing source, said output means of said first signal switching device connected to each of said second and third switching devices, at least two discharge circuits, at least a pair of second connecting means, each different one of said second connecting means respectively interconnecting a different one of said discharge circuits to a different one of said output means of said second signal switching devices, at least two current loading means, at least a pair of third connecting means, each different one of said third connecting means respectively interconnecting a different one of said current loading means to a different one of said output means of said second and third signal switching devices, whereby after said first signal switching means in combination with any one of said second or third signal switching devices is energized by their respective energizing means and after current flows through the one of said two current loading means associated with the one of said second or third signal switching means which has been energized, the distributed capacitance associated with the last-mentioned loading means is automatically discharged through said discharge circuit connected thereto.

2. An electrical signal switching circuit comprising, at least one first current conducting device, said current conducting device having an input, an output and a control element, said input terminal adapted to be connected to an energizing source, first connecting means, at least second and third current conducting devices, each having an input, an output and a control element, said control elements of said second and third switching devices adapted to be respectively connected to an associated energizing source, said output element of said first current conducting device connected to said input elements of said second and third current conducting devices, at least two discharge circuits, at least a pair of second connecting means, each different one of said second connecting means respectively interconnecting a different one of said discharge circuits to a different one of said output terminals of said second switching devices, at least two current loading means, at least a pair of third connecting means, each different one of said third connecting means respectively interconnecting a different one of said current loading means to said output terminal of an associated one of said second or third current conducting devices, whereby after said first current conducting device in conjunction with either said second or third current conducting devices is energized by their respective energizing means and after current flows through the one of said two current loading means associated with the one of said second or third current conducting device which has been energized, the distributed capacitance associated with the last-mentioned loading means is automatically discharged through said discharge circuit connected thereto.

3. An electrical signal switching circuit comprising, first, second and third current conducting devices, each of said current conducting devices respectively having an input element, an output element and a control element, the control elements of said first and second current conducting devices adapted to be respectively connected to first and second energizing means, said input element of said first current conducting device adapted to be connected to a potential source, first connecting means, said first connecting means interconnecting the output element of said first current conducting device to both said control element of said third current conducting device and said input element of second current conducting device, said output element of said third current conducting device adapted to be connected to a potential source, current loading means, a unilateral current conducting device, said unilateral current conducting device having first and second terminals, said first terminal being connected to said current loading means and said second terminal being connected to the input element of said third current conducting device, second connecting means, said second connecting means interconnecting the output element of said second current conducting device to said current loading means and to said first terminal of said unilateral conducting device, whereby after said first and second current conducting devices are energized by their respective energizing means, and after current flows from said first and second current conducting devices to said current loading means, the distributed capacitance across said current loading means is automatically discharged through said unilateral conducting device and said third current conducting device.

4. An electrical signal switching circuit comprising, a first signal switching device having an input and an output element, said input element adapted to be connected to a first energizing means, first connecting means, a second signal switching device having an input element and an output element, said input element of said second signal switching device adapted to be connected to a second energizing means, said output element of said first signal switching device being connected to said input element of said second signal switching device by means of said first connecting means, a discharge device, second connecting means, said second connecting means interconnecting said discharge circuit and said output element of said second signal switching circuit, respectively, current loading means, said current loading means having first and second terminals, third connecting means, said third connecting means interconnecting said first terminal of said current loading means to said second connecting means, a third signal switching device having an input element and an output element, said input element adapted to be connected to a third energizing means, said output element of said switching device adapted to be connected to said second terminal of said current loading means, whereby after said first, second and third switching means are respectively energized by said respective first, second and third energizing means, and after current flows through said current loading means, the distributed capacitance across said current loading means is automatically discharged through said discharge circuit via said second and third connecting means.

5. An electrical signal switching circuit comprising, first, second and third current conducting devices, each said current conducting device having an input, an output and a control element, the control elements of said first and second current conducting devices adapted to be connected to first and second energizing means, respectively, said input element of said first current conducting device adapted to be connected to a potential source, first connecting means, said first connecting means interconnecting the output element of said first current conducting device to both said control element of said third current conducting device and to said input element of said second current conducting device, said output element of said third current conducting device adapted to be connected to a potential source, second connecting means, said second connecting means interconnecting the output element of said second current conducting device to the input element of said third current conducting device, current loading means having a first and second terminal, third connecting means, said third connecting means interconnecting said first terminal of said current loading means to said second connecting means, switching device having an input element and an output element, said input element of said switching device adapted to be connected to a third energizing means, said output element of said switching device adapted to be connected to said second terminal of said current loading means, whereby after said first, second and third energizing means respectively energize said first and second current conducting devices and said switching device, and after current flows through said current loading means, the distributed capacitance across said current loading means is automatically discharged through said third current conducting device.

6. An electrical circuit in accordance with claim 5 wherein said current loading means comprises a word line driver.

7. A matrix selection circuit comprising: a first circuit, a plurality of second circuits, means coupling said first circuit with each of said second circuits, a plurality of third circuits, each different one of said third circuits being coupled to a different one of said second circuits as well as to said first circuit by a connection means, a load connected to the connection means between said second and third circuits, means to energize simultaneously said first circuit and any one of said second circuits thereby causing said load to be energized, after which the distributed capacitance associated with each selected load and which becomes charged up is automatically discharged by means of said third circuit.

References Cited

UNITED STATES PATENTS

| | | | |
|---|---|---|---|
| 2,997,606 | 8/1961 | Hamburger et al. | 307—88.5 |
| 3,050,641 | 8/1962 | Walsh | 307—88.5 |
| 3,157,797 | 11/1964 | Eshelman | 307—88.5 |
| 3,171,984 | 3/1965 | Eshelman et al. | 307—88.5 |

ARTHUR GAUSS, *Primary Examiner.*

S. D. MILLER, *Assistant Examiner.*